United States Patent
Zhu et al.

(10) Patent No.: US 10,166,518 B2
(45) Date of Patent: Jan. 1, 2019

(54) MULTI-HEATER METHOD FOR GROWING HIGH QUALITY DIAMOND

(71) Applicant: Sunset Peak International Limited, Singapore (SG)

(72) Inventors: Hexiang Zhu, Bradenton, FL (US); Karl Pearson, Bradenton, FL (US)

(73) Assignee: SUNSET PEAK INTERNATIONAL LIMITED, Singapore (SG)

( * ) Notice: Subject to any disclaimer, the term of this patent is extended or adjusted under 35 U.S.C. 154(b) by 0 days.

(21) Appl. No.: 15/610,627

(22) Filed: Jun. 1, 2017

(65) Prior Publication Data

US 2017/0266634 A1    Sep. 21, 2017

Related U.S. Application Data

(62) Division of application No. 13/157,899, filed on Jun. 10, 2011, now abandoned.

(51) Int. Cl.
*C30B 1/06* (2006.01)
*B01J 3/06* (2006.01)
*C30B 29/04* (2006.01)

(52) U.S. Cl.
CPC .............. *B01J 3/062* (2013.01); *B01J 3/067* (2013.01); *C30B 29/04* (2013.01); *B01J 2203/061* (2013.01); *B01J 2203/062* (2013.01); *B01J 2203/068* (2013.01); *B01J 2203/0655* (2013.01); *Y10T 117/10* (2015.01)

(58) Field of Classification Search
CPC .... C30B 1/00; C30B 1/02; C30B 1/06; C30B 1/08; C30B 1/12; C30B 29/00; C30B 29/02; C30B 29/04; Y10T 117/00; Y10T 117/10; Y10T 117/1004; Y10T 117/1008; Y10T 117/1016
USPC ......... 117/4, 6–7, 9, 200–202, 204, 928–929
See application file for complete search history.

(56) References Cited

U.S. PATENT DOCUMENTS

| 4,034,066 A | 7/1977 | Strong et al. | |
|---|---|---|---|
| 4,632,817 A * | 12/1986 | Yazu | B01J 3/062 117/41 |
| 4,836,881 A | 6/1989 | Satoh et al. | |
| 2006/0288927 A1 * | 12/2006 | Chodelka | B01J 3/065 117/79 |

* cited by examiner

*Primary Examiner* — Kenneth A Bratland, Jr.
(74) *Attorney, Agent, or Firm* — Kang S. Lim (57) ABSTRACT

Disclosed herein is an apparatus and method for growing a diamond. The apparatus for growing a diamond comprises: a reaction cell that is configured to grow the diamond therein; a main heater including a main heating surface that is arranged along a first inner surface of the reaction cell; and a sub-heater including a sub-heating surface that is arranged along a second inner surface of the reaction cell, the second inner surface being non-parallel with the first inner surface.

16 Claims, 9 Drawing Sheets

MULTI-HEATER METHOD FOR GROWING HIGH QUALITY DIAMOND

BACKGROUND

Field of the Invention

The present subject matter relates generally to an apparatus and method for growing a diamond, and more specifically to an apparatus and method for growing a diamond using a plurality of heaters.

Related Art

The synthesis of diamond crystals by high temperature, high pressure processes via a temperature gradient method was established by the General Electric Company as described in U.S. Pat. No. 4,034,066. As a result of subsequent large-scale production by Sumitomo Electric Industries, Ltd., as described in U.S. Pat. No. 4,836,881, diamonds synthesized by this method are commercially available as heat sinks, super-precision cutting tools, and other fabricated products. The diamond growth process using a high temperature, high pressure apparatus can include a reaction cell which contains (a) graphite as a carbon source, (b) a diamond seed crystal, and (c) a solvent metal which separate the carbon source from the seed crystal.

During the growth of diamond crystals, the carbon source dissolves in solvent metal upon heating, and a temperature gradient exists between the carbon source and the seed crystal, thereby permitting diamond crystal to grow on seed crystal. The growth rate and the diamond quality depend not only on the applied temperature and pressure, but also on the alloy chemistry and core geometry. In addition, the growth rate strongly depends on the temperature gradient and difference between the dissolution site and growth site. As crystal growth continues, the positions of the materials shift and change. As a result, the temperature difference and gradient also changes, which result in either slowing down of the growth rate or incorporation of inclusions within the grown diamonds.

Conventional processes for growing diamonds adopted a single heater system which causes a fixed temperature gradient in the cell. One of the shortcomings of these systems is that the initial growth rate is higher than later growth rate due to the actual temperature gradient decreasing as the crystal grows. As the crystal reaches a certain size, growth will stop since no temperature gradient exists. Hence, according to the conventional method, in order to increase the productivity, the temperature gradient must be set as high as possible at the beginning. However, while this conventional method may increase the initial growth rate of diamond, this leads to another disadvantage, i.e., more inclusions incorporated in the diamond crystals. Thus, to grow high-quality yellow diamond crystals using a single heater, the growth rate is to be limited, which is normally below 6 mg per hour. But, for certain chemistries and geometries, it is ideal to start with a slow growth rate at the beginning to eliminate the inclusions, and increase the growth rate later on to increase productivity.

SUMMARY OF THE INVENTION

One of the distinctive aspects of the presently claimed subject matter is to provide a multi-heater system for growing high quality diamond at improved growth rates. The multi-heater systems disclosed herein have various advantages, which include the precise control of temperature gradients independent of one another, if so desired.

The present subject matter provides an apparatus and method for growing a diamond. According to an aspect of the subject matter, the apparatus includes a reaction cell that is configured to grow the diamond therein; a main heater including a main heating surface that is arranged along a first inner surface of the reaction cell; and a sub-heater including a sub-heating surface that is arranged along a second inner surface of the reaction cell, the second inner surface being non-parallel with the first inner surface.

According to another aspect of the subject matter, the reaction cell contains therein a multi-layer structure including a diamond seed, the main heater and the sub-heater being configured to heat the multi-layer structure from different angles.

According to a further aspect of the subject matter, the first inner surface of the reaction cell is arranged approximately orthogonal to the second inner surface of the reaction cell.

According to a further aspect of the subject matter, the first heating surface of the main heater is cylindrical in shape and the second heating surface of the sub-heater is in the shape of a disc.

According to a further aspect of the subject matter, the second heating surface of the sub-heater includes two electrodes that are approximately 180° apart from each other.

According to a further aspect of the subject matter, the apparatus further includes a third heater including a third heating surface that is arranged apart from and in parallel to the first heating surface of the main heater.

According to a further aspect of the subject matter, the third heating surface of the third heater is in the shape of a ring.

According to a further aspect of the subject matter, the third heater includes two electrodes that are approximately 180° apart from each other.

According to a further aspect of the subject matter, the apparatus further includes a fourth heater including a fourth heating surface that is arranged in the reaction cell on a side opposite the second heating surface of the sub-heater.

According to a further aspect of the subject matter, the apparatus further includes a fifth heater including a fifth heating surface that is arranged in parallel with the fourth heating surface of the fourth heater, the fourth and fifth heating surfaces being in disc shape.

According to a further aspect of the subject matter, the first heating surface of the main heater is in a cylindrical shape and the third heating surface of the third heater is in a ring shape; and wherein the sub-heater, the third heater, and fifth heater are positioned on a top side of the main heater.

According to a further aspect of the subject matter, the apparatus further includes a controller that controls the main heater and the sub-heater independently.

According to a further aspect of the subject matter, the main heating surface of the main heater contains graphite and the sub-heating surface of the sub-heater contains graphite and Molybdenum (Mo).

According to another aspect of the subject matter, the method of growing a diamond in a reaction cell containing a carbon source, a solvent metal, and a diamond seed crystal, includes: controlling a main heater including a main heating surface that is arranged along a first inner surface of the reaction cell in such a way that the main heating surface is heated up to allow the carbon source to dissolve in the solvent metal; and controlling a sub-heater including a sub-heating surface that is arranged along a second inner surface of the reaction cell in such a way that the sub-heating surface is heated up to allow the carbon source to dissolve in the solvent metal, wherein the second inner surface is non-parallel with the first inner surface.

According to a further aspect of the subject matter, the method further includes:

after controlling the main heater and the sub-heater, controlling a third heater including a third heating surface that is arranged apart from and in parallel to the first heating surface of the main heater in such a way that the third heating surface is heated up to increase a temperature gradient existing between the carbon source and the diamond seed crystal.

According to a further aspect of the subject matter, the step of controlling the third heater begins after a predetermined time period after the step of controlling the main heater begins.

According to a further aspect of the subject matter, the predetermined time period is more than 24 hours.

According to a further aspect of the subject matter, the steps of controlling the main heater, sub-heater, and third heater is programmed to achieve an optimized condition for producing high-quality transparent yellow diamond crystals.

According to another aspect of the subject matter, the apparatus for growing a diamond, includes: a reaction cell that is configured to grow the diamond therein; a first heater including a first heating surface that is arranged along an inner surface of the reaction cell; and a second heater including a second heating surface that is arranged substantially parallel to the first heating surface of the first heater, the second heating surface being smaller than the first heating surface.

According to a further aspect of the subject matter, the first heating surface of the first heater is in cylindrical shape and the second heating surface of the second heater is arranged outside of the first heating surface of the first heater so that the first and second heating surfaces are overlapped with respect to a central axis of the cylindrical first heating surface.

BRIEF DESCRIPTION OF THE DRAWINGS

These and other aspects of the subject matter will be apparent with reference to the examples in the following description and with reference to the accompanying drawings.

DETAILED DESCRIPTION OF THE INVENTION

The Figures are diagrammatic and not drawn to scale. In the Figures, elements which correspond to elements already described have the same reference numerals.

Figure 1:
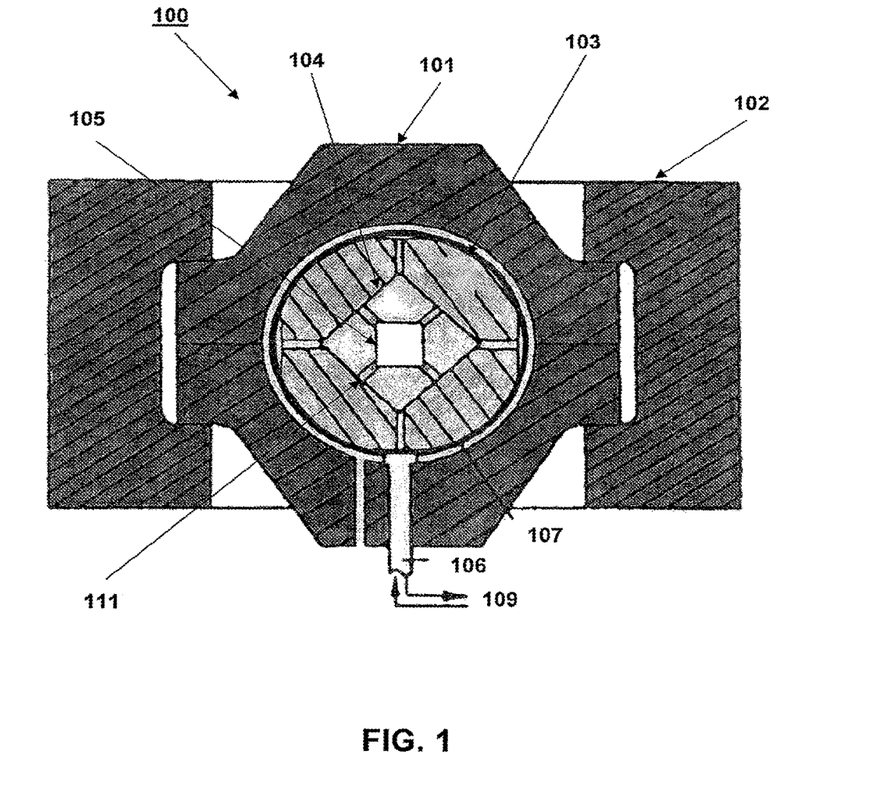
FIG. 1 shows a vertical cross-section view of an embodiment of the present subject matter.

FIG. 1 shows a vertical cross-section view of an embodiment of the present subject matter. In FIG. 1, a split-sphere high pressure, high temperature (HPHT) apparatus 100 includes a split-sphere growth chamber 101 and a plurality of safety clamps 102 on opposite sides of the growth chamber 101. The growth chamber 101 comprises a top half and a bottom half, with a cavity defined therein. Large dies 103, small dies 104, and a reaction cell 105 are positioned in the cavity. Between the inner surface of the growth chamber 101 and the large dies 103 is provided rubber membrane (or diaphragm) 107.

In operation of the HPHT apparatus 100, as the top and bottom halves of the growth chamber 101 are brought together, pressure is applied to the large dies 103, which in turn apply pressure to the small dies 104. As pressure is applied to the small dies 104, the dies apply pressure to the reaction cell 105. Prior to being placed in the growth chamber 101, the reaction cell 105 is charged with a graphite source, a diamond seed, and a metal solvent/catalyst mixture used to produce a diamond. Graphite sources, diamond seeds and solvent/metal catalysts are generally known in the art, and any such material is appropriate for use in the apparatus of the present subject matter.

The HPHT apparatus 100 also contains at least one manifold 106 though which cooling water 109 can access to the cavity of the growth chamber 101 from outside of the apparatus 100, and the cooling water 109 can access in opposite direction. In the embodiment depicted in FIG. 1, the manifold is at least a two-way manifold, allowing a user to either draw gases and other substances out of the growth chamber 101 or introduce different gases or material into the growth chamber 101. For example, a user can remove impurities from the growth chamber 101. Alternatively, the flow can be reversed to introduce an inert gas or some other desired gas into the growth chamber 101 by way of the manifold. An advantage to using a manifold rather than multiple inlets is that the number of locations where the chamber is exposed to contamination is kept to a minimum thereby ensuring that the inside of the reaction cell 105 and the split sphere chamber 101 can be kept under adequate control.

Figure 2:
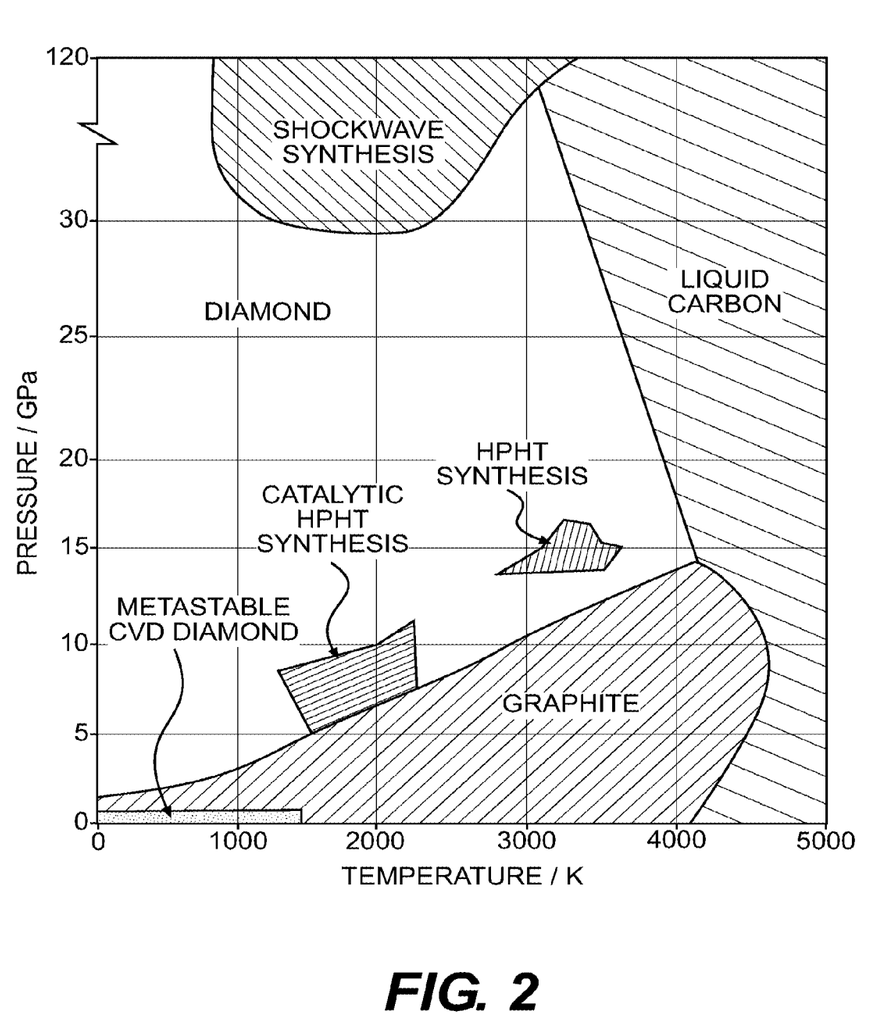
FIG. 2 shows a related-art carbon equilibrium phase diagram showing the region where diamond grows using metal catalyst solvents in high pressure high temperature (HPHT) diamond synthesis (Department of Chemistry Website, University of Bristol, U.K.).
Figure 3:
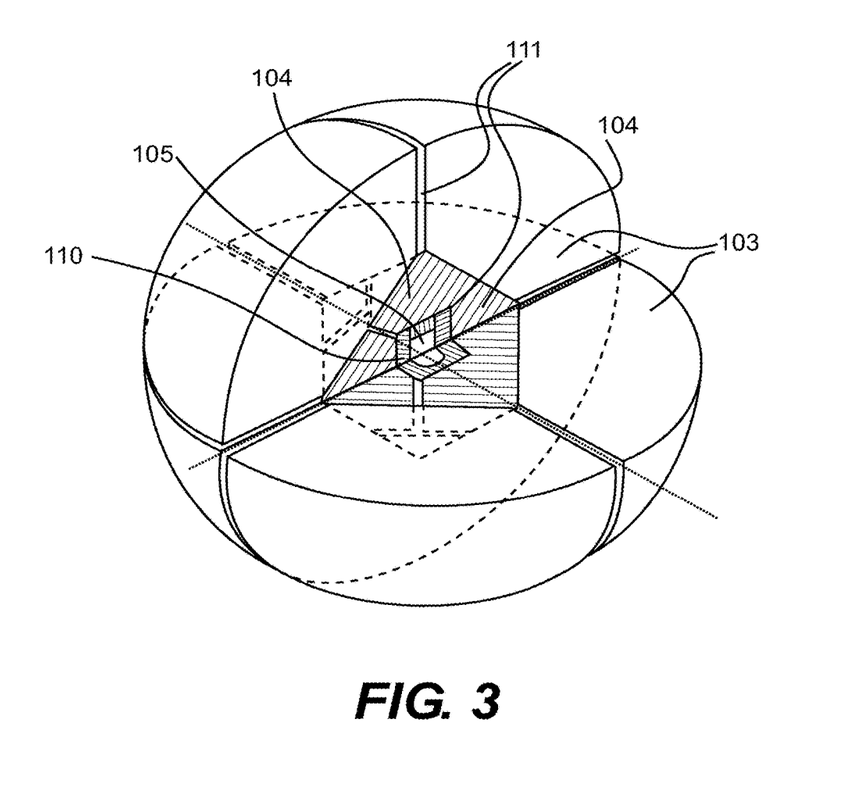
FIG. 3 shows a three-dimensional view of the large and small dies, the core area as well as the gaps between the dies for the flow of cooling water.
Figure 4:
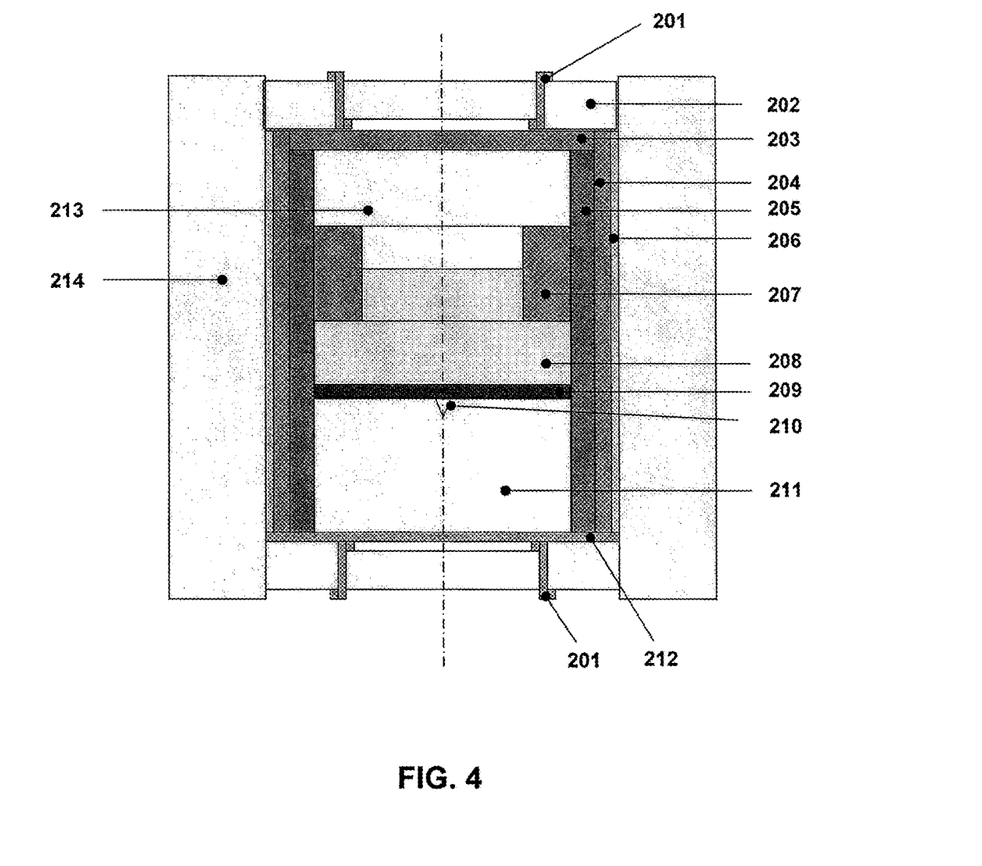
FIG. 4 schematically shows a multi-heater system with a sub-heater on the top of the cell, according to a first embodiment of the present subject matter.

In the HPHT apparatus 100 disclosed in FIG. 1, the reaction cell 105 is configured to contain a diamond seed crystal 210, a carbon source 207, and a catalyst separation layer 209 provided between the diamond seed crystal 210 and the carbon source 207 (reference numerals referring to FIG. 4). Crystal growth is caused by extremely high isostatic pressures (i.e., equal from all sides) and a temperature gradient due to resistance heating in the reaction cell where the maximum temperature is located at the carbon source 207 and the minimum temperature at the seed crystal 210. The temperatures and pressures in the reaction cell 105 are in the diamond stable region of the carbon phase diagram as shown in FIG. 2. The pressure created at the core surface is based on the geometry of the dies 103, 104, or more specifically, the decrease in the surface area or interaction area between the rubber membrane 107 and the large die 103 in contrast to the interface area between the small dies 104 and the reaction cell 105. The relationship of the large and small dies 103, 104 as well as the reduction in surface area is shown in FIG. 3. The three-dimensional view in FIG. 3 also shows the gaps 111 between the dies 103, 104 for allowing cooling water to flow through the system. This design allows the pressure at the rubber membrane to be relatively small yet create ultra high isostatic pressure at the core cell 105.

A multi-heater system within a reaction cell includes a main heater in the shape of a cylinder being made from graphite and additional heaters in the shape of a disc or a ring being made from graphite, Mo, or other conductors. The system includes a main heater in the shape of a cylinder being made from graphite and additional heaters in the shape of a disc or a ring being made from graphite and/or Mo. It is understood that the ring is generally annular in shape. The multi-heater system has the ability to precisely control the temperature gradient and temperature profile and thus the crystal growth rate. Four embodiments are illustrated in FIG. 4 to FIG. 7.

FIG. 4 schematically shows the multi-heater system having two heaters, a main heater 204 provided on a side of the reaction cell 105 and a sub-heater 203 on the top of the reaction cell 105. The side of the reaction cell 105 is arranged approximately orthogonal to the top of the reaction cell 105. The sub-heater 203 includes two electrodes 201 that are approximately 180° apart from each other. The embodiment illustrated in FIG. 4 is provided with a couple of Mo rings (electric lead) 201; ZrO$_2$ caps (press media and heat insulator) 202; a graphite disc (sub-heater) 203; a graphite cylinder (main heater) 204; a MgO cylinder (protector) 205; a CsCl sleeve (protector) 206; a graphite tube (diamond source) 207; metal solvent 208; a metal foil (protecting seed dissolved) 209; a diamond seed 210; a seed pad 211; a metal or graphite disc 212; a top ceramic disc 213; and a container (press media and heat insulator) 214. As can be seen, in this embodiment, the main heater 204 is located on the side inner surface of the container 214 while the sub-heater 203 is located under the ZrO$_2$ caps 202 but on the top of the top ceramic disc 213.

Figure 5:
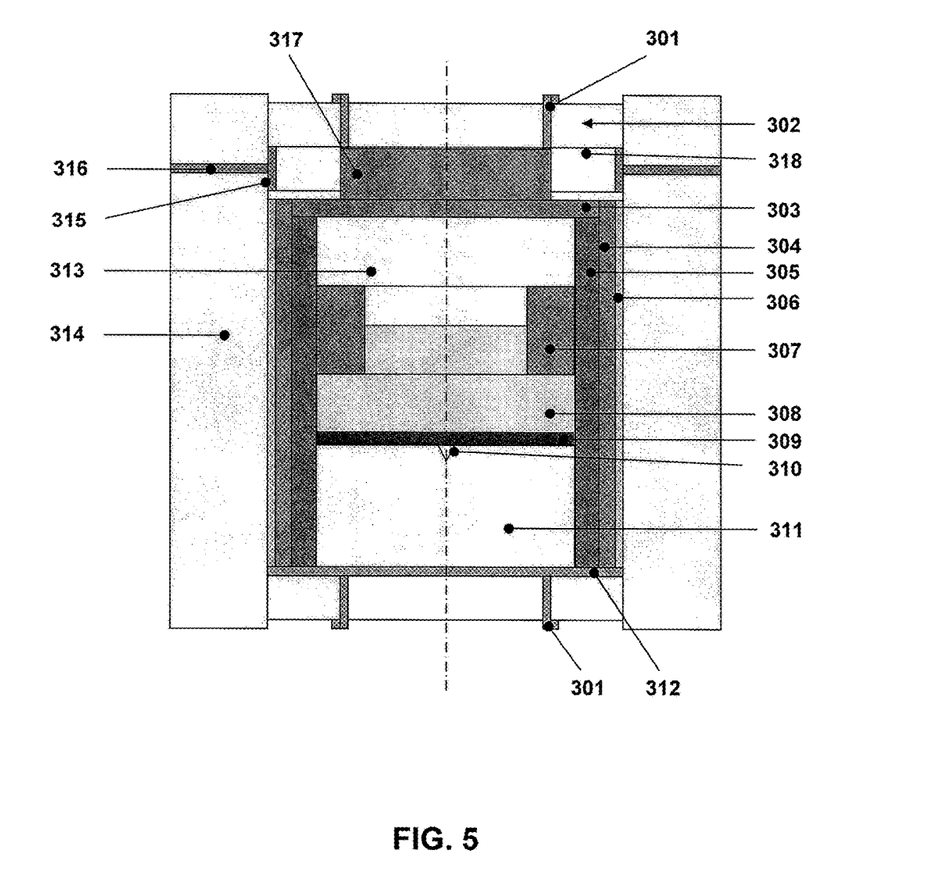
FIG. 5 schematically shows a multi-heater system with a second independent heater on the top of the cell, according to a second embodiment of the present subject matter.

FIG. 5 schematically shows a multi-heater system having five heaters, a main heater 304 and a second independent heater 315 provided on a side of the reaction cell 105, a first sub-heater 317 and a second sub-heater 303 on the top of the reaction cell 105, and a third sub-heater 312 on the bottom of the reaction cell 105. The side of the reaction cell 105 is arranged approximately orthogonal to the top of the reaction cell 105, and the bottom of the reaction cell 105 is arranged approximately orthogonal to the side of the reaction cell 105. The first sub-heater 317 includes two electrodes 301 that are approximately 180° apart from each other. The second independent heater 315 includes two electrodes 316 that are approximately 180° apart from each other. The third sub-heater 312 includes a heating surface that is arranged in the reaction cell 105 on a side opposite the heating surface of the first sub-heater 317. The second sub-heater 303 includes a heating surface that is arranged in parallel with the heating surface of the third sub-heater 312, the heating surfaces of the second and third sub-heaters 303, 312 being in disc shape.

The embodiment illustrated in FIG. 5 is provided with a couple of Mo rings (electric lead) 301; ceramic caps (press media and heat insulator) 302; a BN ring 318; a graphite disc (second sub-heater) 303; a graphite cylinder (main heater) 304; a MgO cylinder (protector) 305; a CsCl sleeve (protector) 306; a graphite tube (diamond source) 307; metal solvent 308; a metal foil (protecting seed dissolved) 309; a diamond seed 310; a seed pad 311; a metal or graphite disc (third sub-heater) 312; a graphite disc or ring (first sub-heater) 317; a couple of graphite rods (electrical lead for second independent heater) 316; a graphite ring (second independent heater) 315; a top ceramic disc 313; and a container (press media and heat insulator) 314. As can be seen, in this embodiment, the main heater 304 and the second independent heater 315 are located on the side inner surface of the container 314, the main heater 304 being located below the second independent heater 315, the first and second sub-heaters 317, 303 are located under the ceramic caps 302, the second sub-heater 303 being located below the first sub-heater 317, and the third sub-heater 312 is located on the bottom side of the reaction cell 105.

Figure 6:
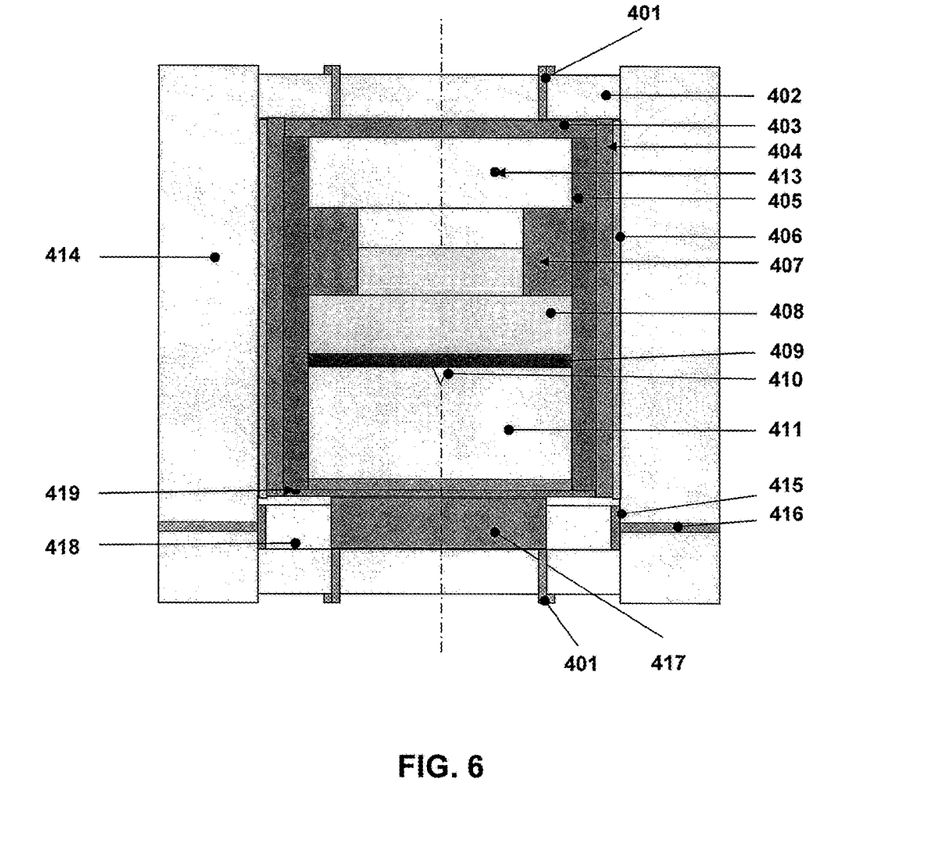
FIG. 6 schematically shows a multi-heater system with a second independent heater on the bottom of the cell, according to a third embodiment of the present subject matter.

FIG. 6 schematically shows another embodiment of a multi-heater system having five heaters, a main heater 404 and a second independent heater 415 provided on a side of the reaction cell 105, a first sub-heater 403 on the top of the reaction cell 105, and a second sub-heater 417 and the third sub-heater 419 on the bottom of the reaction cell 105. The side of the reaction cell 105 is arranged approximately orthogonal to the top of the reaction cell 105, and the bottom of the reaction cell 105 is arranged approximately orthogonal to the side of the reaction cell 105. The first sub-heater 403 includes two electrodes 401 that are approximately 180° apart from each other. The second independent heater 415 includes two electrodes 416 that are approximately 180° apart from each other. The second sub-heater 417 includes a heating surface that is arranged in the reaction cell 105 on a side opposite the heating surface of the first sub-heater 403. The third sub-heater 419 includes a heating surface that is arranged in parallel with the heating surface of the second sub-heater 417, the heating surfaces of the second and third sub-heaters 417, 419 being in disc shape.

The embodiment illustrated in FIG. 6 is provided with a couple of Mo rings (electric lead) 401; ceramic caps (press media and heat insulator) 402; a graphite disc (first sub-heater) 403; a graphite cylinder (main heater) 404; a top ceramic disc 413; a MgO cylinder (protector) 405; a CsCl sleeve (protector) 406; a graphite tube (diamond source) 407; metal solvent 408; a metal foil (protecting seed dissolved) 409; a diamond seed 410; a seed pad 411; a graphite ring (second independent heater) 415; a couple of graphite rods (electrical lead for second independent heater) 416; a graphite disc or ring (second sub-heater) 417; BN or MgO or salt ring 418; a graphite disc (third sub-heater) 419; and a container (press media and heat insulator) 414. As can be seen, in this embodiment, the main heater 404 and the second independent heater 415 are located on the side inner surface of the container 414, the second independent heater 415 being located below the main heater 404, the first sub-heater 403 is located under the ceramic caps 402, and the second and third sub-heaters 417, 419 are located on the bottom side of the reaction cell 105, the second sub-heater 417 being located below the third sub-heater 419.

Figure 7:
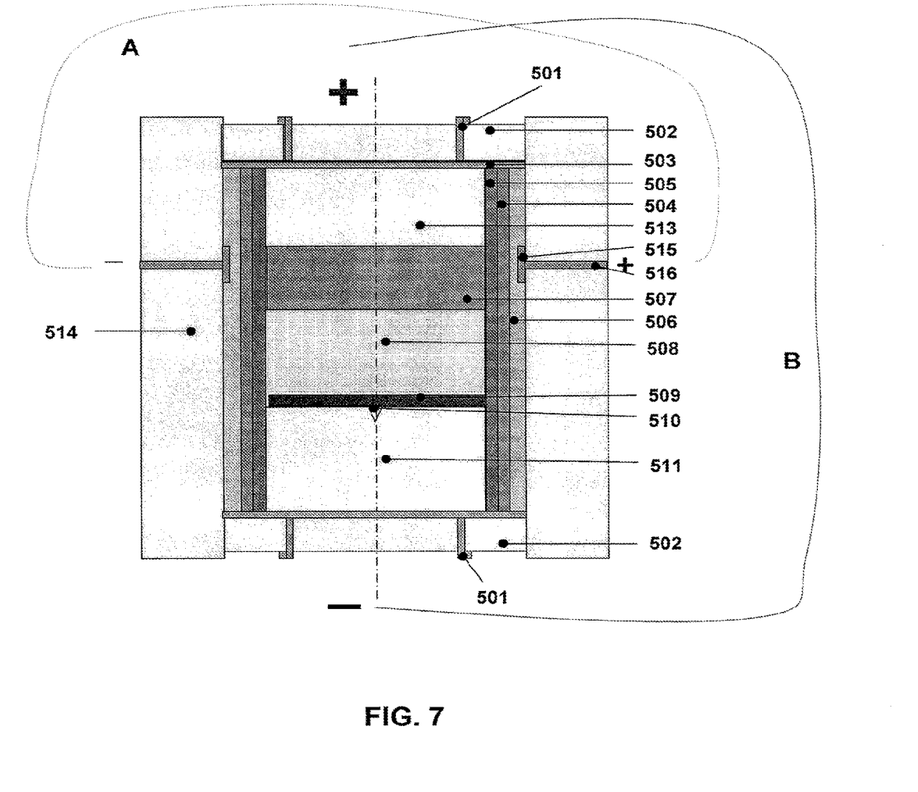
FIG. 7 schematically shows a multi-heater system with a second independent heater on the side of the cell, according to a fourth embodiment of the present subject matter.

FIG. 7 schematically shows a further embodiment of a multi-heater system having two heaters, a main heater 504 and a second independent heater 515 provided on a side of the reaction cell 105. The heating surface of the second independent heater 515 is smaller than that of the main heater 504. The embodiment illustrated in FIG. 7 is provided with a couple of Mo rings (electric lead) 501; ceramic caps (press media and heat insulator) 502; Mo discs (electric conductor) 503; a MgO cylinder (protector) 505; a graphite cylinder (main heater) 504; a top ceramic disc 513; a graphite ring (second independent heater) 515; a couple of graphite rods (electrical lead for second independent heater) 516; a graphite disc or tube (diamond source) 507; a CsCl sleeve (protector) 506; metal solvent 508; a metal foil (protecting seed dissolved) 509; a diamond seed 510; a seed pad 511; and a container (press media and heat insulator) 514. Also, it is also illustrated that an electrical connection B between the couple of Mo rings 501 by a main power supply (not shown) and another electrical connection A between the couple of graphite rods 516 by a second power supply (not shown). As can be seen, in this embodiment, the main heater 504 and the second independent heater 515 are arranged on the side inner surface of the container 514, wherein the second independent heater 515 is located under the main heater 504.

There can be two sets of power supply (not shown), one for the main heater and sub-heater and the other one for a second independent heater. The reaction cell 105 is a ceramic container (primarily zirconia) with one set of electrical contacts on the ends to permit current to flow through the reaction cell 105 from the top small die 104 to the bottom small die 104, and another set of electric contacts on the sides to permit current to flow through the second independent heater from the right small die to the left small die. The second independent heaters can be placed at different locations within the cell. It can be located at the top as in FIG. 5, the bottom as in FIG. 6, and the side as in FIG. 7 of the cell. The sub-heaters are normally located only at the top and/or the bottom of the cell. The multi-heater system allows control of the temperature gradients independent of each other, if so desired. The system has the ability to precisely control the temperature gradient and temperature profile and thus the crystal growth speed during the HPHT process. The graphite heaters inside the reaction cell provide adequate temperature through resistance heating.

Figure 8:
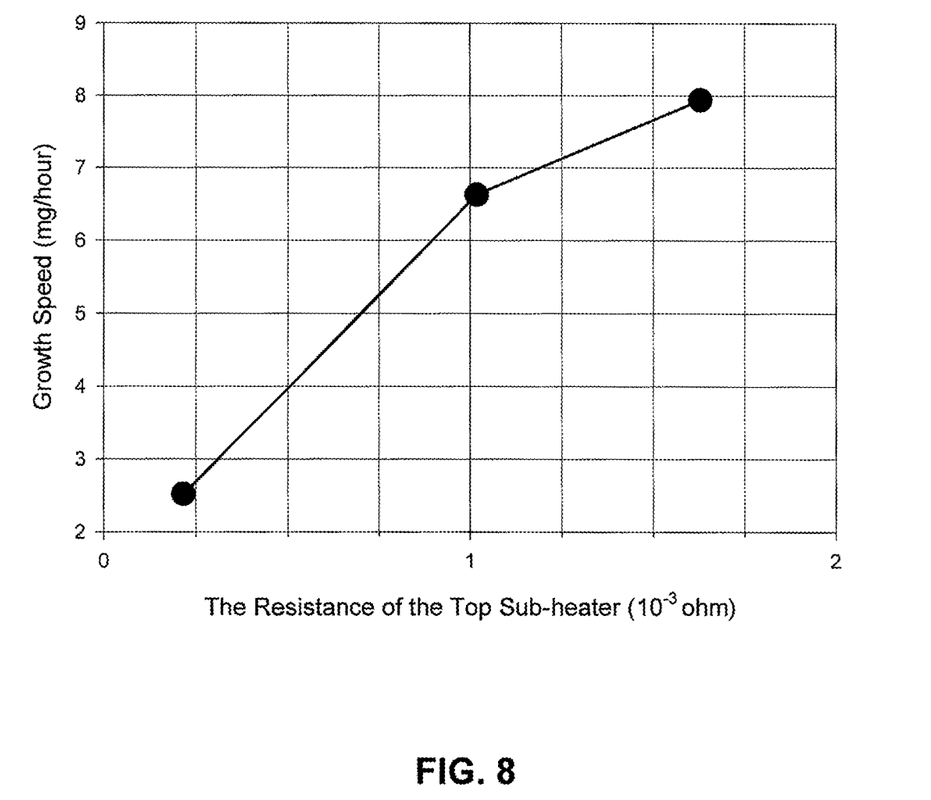
FIG. 8 shows the effect of the top sub-heater electric resistance on the growth speed of the diamond crystals.

In an experiment, the entire reaction cell was placed in the HPHT apparatus at a pressure between 5.0 and 7.5 GPa and current through the main heater was slowly increased to reach a desired temperature, i.e., between 1200 and 1700° C. The diamond crystals are produced by a temperature gradient technology. The temperature gradient and temperature profile throughout the reaction cell can be controlled further by the introduction of sub-heaters and second independent heaters with variant resistance. An example of the influence of the modification of top sub-heater electric resistance on the growth rate is given in FIG. 8.

With the present design, high quality colorless, green, green-yellow, blue and yellow diamond crystals have been successfully produced repeatedly at a growth speed up to 15 mg/hour. For yellow crystals, it is desirable to have the sub-heater on the top of the cell as in FIG. 4 and the second independent heater on the top as in FIG. 5 or the side as in FIG. 7 of the cell. During the HPHT process, initially, only the main heater and sub-heaters were used to provide enough power for the catalyst alloy liquid to melt and dissolve the graphite and the fixed temperature gradient for diamond to grow. After a certain amount of time, usually more than 24 hours, a good quality diamond crystal with a size up to 1 ct. will be produced, and then, the second independent heater was used with the main heater and its power was slowly raised to increase the temperature gradient and thus the growth rate. The power generated from the main heater, sub-heaters and second independent heater can be programmed to achieve the optimized conditions for the production of high-quality transparent yellow diamond crystals with very high growth rates up to 15 mg/hour.

For the colorless stones, it is desirable to have the second independent heater on the bottom as in FIG. 6 of the cell and the sub-heaters on the top and the bottom. At the beginning of the HPHT process, both power supplies were turned on so that the temperature gradient was very small for the colorless crystal to grow at very low growth rate, which reduced the amount of inclusions and defects during its initial growth. During the process, the power of the second independent heater was slowly lowered to increase the temperature gradient of the reaction cell. The power generated by the main heater, sub-heaters and second independent heaters can be programmed to achieve the optimized conditions for the production of high-quality transparent colorless diamond crystals at a growth rate over 3 mg/hour.

Figure 9:
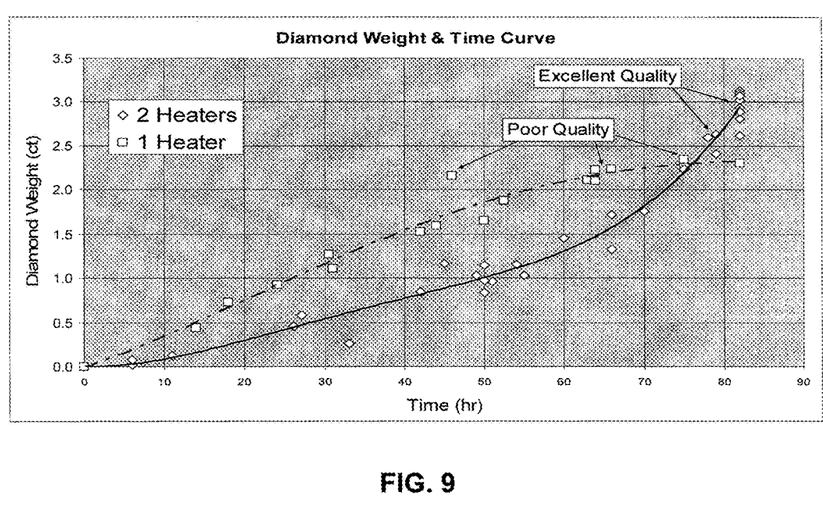
FIG. 9 shows yellow diamond growth curves of the cores with one heater and the two heaters according to the second embodiment of the present subject matter wherein the second heater is on the top side of the cell.

FIG. 9 shows yellow diamond growth curves of the cores with one heater and the two heaters according to the second embodiment of the present subject matter, wherein the second heater is on the top side of the cell. In this experiment, the multi-heater system similar to that shown in FIG. 7 was adopted. After 82 hours, the diamonds grown with two heaters have better quality and larger weight than the diamonds grown with only one heater. The detailed conditions used in this experiment are as follows:

Heating temperature: 1350-1450° C.;

The size of the main heater (OD (outer diameter)×ID (inner diameter)×L (length)): 15.15×16.25×24.00 mm;

The size of the second independent heater (OD×ID×L): 17.15×16.25×2.00 mm;

Mo rings (electric lead) (OD×ID×L): 8.35×8.25×3.10 mm;

Ceramic caps (press media and heat insulator) (OD×L): 17.30×3.10 mm;

Mo Discs (electric conductor) (OD×L): 17.30×0.10 mm;

MgO cylinder (protector) (OD×ID×L): 14.10×12.20×24.00 mm;

Top ceramic disc (OD×L): 12.10×6.80 mm;

Graphite rod (electrical lead for second independent heater) (OD×L): 1.10×3.60 mm;

Graphite disc or tube (diamond source) (OD×L): 12.10×4.00 mm;

CsCl sleeve (protector) (OD×ID×L): 17.25×15.25×24.00 mm;

Metal solvent (OD×L): 12.10×7.00 mm;

Metal foil (protecting seed dissolution) (OD×L): 12.10×0.10 mm;

Diamond seed: 30 Mesh;

Seed pad (OD×L): 12.10×6.40 mm;

Container (press media and heat insulator; a rectangular with a hole) (Width1×Width 2×L×ID): 24.20×24.20×30.50×17.40 mm;

The pressure for the experiment: 5.50-6.0 GPa;

Material for metal catalyst: Fe—Ni alloy;

All the components have the same condition except for the two-heater system having a secondary heater at the top part of the core, which is located at a position of 9.0 mm far from the top of the container.

The experimental results comparing the one heater system versus the two heater system are shown on Table 1 below:

TABLE 1

| Description | # of Runs | Grade 1 | Grade 1, 2 | Grade 1, 2, 3 | Avg. Size cts. |
|---|---|---|---|---|---|
| One Heater | 184 | 25% | 54% | 71% | 3.36 |
| Two Heaters | 3948 | 43% | 67% | 79% | 3.83 |

Based on the results above, one of ordinary skill in the art will clearly understands that the qualities of diamonds produced by the two heater system according to the present subject matter are unexpectedly higher than those produced by the one heater system.

Although the subject matter has been described with reference to the illustrated embodiment, the subject matter is not limited thereto. The subject matter being thus described, it will be obvious that the same may be varied in many ways. Such variations are not to be regarded as a departure from the spirit and scope of the subject matter, and all such modifications as would be obvious to one skilled in the art are intended to be included within the scope of the following claims.

What is claimed is:

1. A method of growing a diamond in a reaction cell containing a carbon source, a solvent metal, and a diamond seed crystal, the method comprising:
    preparing a high temperature, high pressure (HTHP) apparatus to enclose a reaction cell and subjecting the reaction cell to an isostatic pressure ranging from 5 to 7.5 GPa and a temperature ranging from 1200 to 1700 degree C.;
    surrounding the reaction cell with a main heater, a first sub-heater and a second sub-heater, with the first sub-heater located at a top end of the main heater and the second sub-heater located at a bottom end of the main heater, with the main heater, first sub-heater and second sub-heater being powered from a first power supply;
    surrounding the main heater, the first sub-heater and the second sub-heater with heat insulators;
    controlling the main heater, the first sub-heater and the second sub-heater to melt the solvent metal and to create a predetermined temperature gradient from a high near the carbon source to a low at the diamond seed crystal;
    allowing both the carbon source to dissolve in the molten solvent metal and the diamond seed crystal to grow to an initiation size for a predetermined time period;
    controlling a second independent heater, which is configured as a ring heater disposed around the reaction cell to adjust the predetermined temperature gradient after elapsed of the predetermined time period, with the ring heater being powered from a second power supply; and
    allowing the dissolved carbon in the molten solvent metal to deposit on the diamond seed crystal to obtain diamond at a controllable growth rate and with a controllable amount of inclusions.

2. The method according to claim 1, wherein the predetermined time period is more than 24 hours.

3. The method according to claim 2, with the ring heater being located around the first sub-heater, wherein: the step of controlling the ring heater comprises increasing the heating power and increasing the predetermined temperature gradient to increase the diamond growth rate to produce high-quality transparent yellow diamond crystals.

4. The method according to claim 2, with the ring heater being located around the first sub-heater, wherein: the step of controlling the ring heater comprises increasing the heating power and increasing the predetermined temperature gradient to increase the diamond growth rate to produce high-quality green, green-yellow or blue diamond crystals.

5. The method according to claim 3, wherein the step of controlling also results in raising a temperature profile for diamond growth.

6. The method according to claim 4, wherein the step of controlling also results in raising a temperature profile for diamond growth.

7. The method according to claim 2, with the ring heater being located around the main heater, wherein: the step of controlling the ring heater comprises increasing the heating power and increasing the predetermined temperature gradient to increase the diamond growth to produce high-quality transparent yellow diamond crystals.

8. The method according to claim 2, with the ring heater being located around the main heater, wherein: the step of controlling the ring heater comprises increasing the heating power and increasing the predetermined temperature gradient to increase the diamond growth rate to produce high-quality green, green-yellow or blue diamond crystals.

9. The method according to claim 7, wherein the step of controlling also results in raising a temperature profile for diamond growth.

10. The method according to claim 8, wherein the step of controlling also results in raising a temperature profile for diamond growth.

11. The method according to claim 2, with the ring heater being disposed around the second sub-heater, wherein: the step of controlling the ring heater comprises decreasing the heating power, and as a result increasing the predetermined temperature gradient but lowering a temperature profile so that: the diamond growth rate is reduced; and the amount of inclusions is reduced to produce high-quality transparent colourless diamond crystals.

12. The method according to claim 1, wherein the isostatic pressure ranges from 5.5 to 6 GPa and the temperature ranges from 1350 to 1450 degree C.

13. The method according to claim 3, wherein the diamond growth rate is no more than 15 mg/hour.

14. The method according to claim 4, wherein the diamond growth rate is no more than 15 mg/hour.

15. The method according to claim 7, wherein the diamond growth rate is no more than 15 mg/hour.

16. The method according to claim 8, wherein the diamond growth rate is no more than 15 mg/hour.

* * * * *